United States Patent [19]
Wyland

[11] Patent Number: 5,440,715
[45] Date of Patent: Aug. 8, 1995

[54] METHOD AND APPARATUS FOR EXPANDING THE WIDTH OF A CONTENT ADDRESSABLE MEMORY USING A CONTINUATION BIT

[75] Inventor: David C. Wyland, San Jose, Calif.

[73] Assignee: Advanced Micro Devices, Inc., Sunnyvale, Calif.

[21] Appl. No.: 44,543

[22] Filed: Apr. 6, 1993

Related U.S. Application Data

[63] Continuation of Ser. No. 543,330, Jun. 27, 1990, abandoned.

[51] Int. Cl.⁶ .............................................. G06F 12/00
[52] U.S. Cl. ................... 395/435; 364/DIG. 1; 364/253; 364/253.1; 364/245; 364/245.31
[58] Field of Search ................................. 395/400, 425

[56] References Cited

U.S. PATENT DOCUMENTS

| | | | |
|---|---|---|---|
| 4,575,818 | 3/1986 | Almy et al. | 365/49 |
| 4,670,858 | 6/1987 | Almy | 395/425 |
| 4,959,811 | 9/1990 | Szczepanek | 365/49 |
| 5,053,991 | 10/1991 | Burrows | 365/49 |
| 5,072,422 | 12/1991 | Rachels | 365/49 |
| 5,130,945 | 7/1992 | Hamamoto et al. | 365/49 |
| 5,319,762 | 6/1994 | Mayer | 395/425 |

*Primary Examiner*—Rebecca L. Rudolph
*Attorney, Agent, or Firm*—Patrick T. King

[57] ABSTRACT

Apparatus and a method for easily expanding the effective width of the data words of a CAM without significantly increasing the basic width of the data storage registers or comparand register. A plurality of comparison blocks each include a register for data words having a predetermined width. Each data word includes a start bit, which indicates that a data word is the first data word of a much larger data word (or data line), and a chain bit, which indicates that a match has occurred between part of a comparand and the data word stored in the register. A maskable comparator provides a match output signal. The start bit is initially loaded into the chain-bit register for a data word. A latch is provided for storing the value of the chain bit from a preceding register into the chain-bit register of a following register. A priority encoder receives the match output signals from each of the comparators of the comparison blocks to identify the highest-priority comparison block, and the corresponding data line.

4 Claims, 7 Drawing Sheets

FIG. 6

| REGISTER | TYPE | SIZE | DIRECTION | DATA SOURCE | DESTINATION |
|---|---|---|---|---|---|
| COMMAND | CMD | 16 | INPUT | D-BUS | — |
| STATUS | CMD | 16 | OUTPUT | — | D-BUS |
| COMPARAND | DATA | 48 | IN/OUT | D-BUS, CAM ARRAY MASK REGISTER | D-BUS, CAM ARRAY MASK REGISTER |
| MASK | DATA | 48 | OUTPUT | COMPARAND REGISTER | D-BUS COMPARAND REGISTER |
| CAM | DATA | 48 | OUTPUT | CAM ARRAY | D-BUS COMPARAND REGISTER |

FIG. 7

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| MTC | MUL | FUL | 0 | S1 | S0 | 0 | 0 | ADDRESS | | | | | | | |

FIG. 8

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| F4 | F3 | F2 | F1 | F0 | S1 | S0 | RES | A7 | A6 | A5 | A4 | A3 | A2 | A1 | A0 |

| OP CODE | OPERATION | | S1 | S0 | A0-A7 | START MATCH |
|---|---|---|---|---|---|---|
| 0 | INITIALIZE | | X | X | X | X |
| 1 | FLAG OUTPUT CONTROL ENABLE/DISABLE | | MTCH | FULL | X | X |
| 2 | 16/48 BIT MODE SELECT | | 48 BIT | X | X | X |
| 3 | COMPARAND REG → MASK REG | | X | X | X | START |
| 4 | MASK REG → COMPARAND REG | | X | X | X | START |
| 5 | SIM → DATA BUS | | X | X | CAM STATE | X |
| 6 | COMPARAND REG → CAM ARRAY | | X | X | CAM DATA | START |
| 7 | CAM ARRAY → COMPARAND REG | | X | X | CAM DATA | START |
| 8 | RESERVED | | X | X | X | X |
| 9 | SKIP CONTROL | PER WORD | 0 | SKIP | CAM STATE | START |
|   |   | ALL WORDS | 1 | SKIP | X | START |
| A | EMPTY CONTROL | PER WORD | 0 | EMPTY | CAM STATE | START |
|   |   | ALL WORDS | 1 | EMPTY | X | START |
| B | COMPARAND REG → DATA BUS | | SEGMENT COUNTER | | WORD CNTR | X |
| C | MASK REG → DATA BUS | | SEGMENT COUNTER | | CAM DATA | X |
| D | CAM ARRAY → CAM REG → DATA BUS | | SEGMENT COUNTER | | CAM DATA | X |
| E | COMPARAND REG → CAM ARRAY, CLEAR S+E | | X | X | CAM DATA | START |
| F | SET SEGMENT COUNTER | | SEGMENT COUNTER | | CAM DATA | X |
| 10 | SET LINE LENGTH | ALL WORDS | 0 | ST | VALUE | X |
| 11 | ST BIT CONTROL | PER WORD | 1 | ST | CAM STATE | X |
|    |                |          | X | X | X | X |

FIG. 9A

| OP CODE | OPERATION | S1 | S0 | A0-A7 | START MATCH |
|---|---|---|---|---|---|
| 12 | WORD COUNTER TO DATA BUS | X | X | X | X |
| 13 | COMPARAND TO WORD COUNTER | X | X | X | X |
| 14 | | X | X | X | X |
| 15 | RESET SEGMENT AND WORD COUNTER | X | X | X | X |

FIG. 9B

METHOD AND APPARATUS FOR EXPANDING THE WIDTH OF A CONTENT ADDRESSABLE MEMORY USING A CONTINUATION BIT

This is a continuation of application Ser. No. 07/543,330 filed on Jun. 27, 1990 now abandoned.

BACKGROUND OF THE INVENTION

1. Field of the Invention

This invention relates to content addressable (CAM), or associative memories, and, more particularly, to techniques for the convenient expansion of the number of bits in a memory word.

2. Prior Art

A Am99C10 CAM memory device produced by Advanced Micro Devices, Inc. of Sunnyvale, Calif., is a 256 word by 48 bit content addressable integrated-circuit memory device which uses a fixed width (48-bit) input word. Masking of all or any of the bits in a word is provided through use of a maskable comparator. Date is transferred to and from the Am99C10 in 16-bit subwords and stored in 48-bit wide registers. No internal provisions are made for expansion of the word-widths beyond 48 bits to, for example, 96 or 144 word-widths.

SUMMARY OF THE INVENTION

It is an object of the invention to provide a technique for easily expanding the width of the words that a CAM can handle without significantly increasing the basic width of the storage registers or comparand.

In accordance with this and other objects of the invention, apparatus and a method for expanding the memory width of a CAM are provided. A content addressable memory system is provided which has the capability of matching a data line formed of lone or more data words, where each of the data words has a predetermined width. A comparand having the same width is stored in a register. A plurality of comparison blocks are provided where each comparison block includes a register means for storing a data word having the predetermined width. The register also includes means for storing a start bit, which indicates that a data word is the first data word of a data line, which is formed from one or more data words. The register additionally includes means for storing a chain bit, which indicates that a match has occurred between the comparand and the data word stored in the register. The comparator provides a match output signal. The start bit of a data word is loaded into the chain-bit register for a data word. A latch is provided for storing the value of the chain bit from a preceding register into the chain-bit register of a following register. A priority encoder receives the match output signals from each of the comparators of the comparison blocks. The priority encoder includes means for providing an output code word identifying the highest-priority comparison block providing a match output signal to the priority encoder.

The invention includes a number of additional features. Masking means are provided for masking predetermined bits of the data words, wherein the masking means includes a mask register set for containing the masking words corresponding to the various words of a data line. A word counter for keeping track of the data words of a data line is provided. Logic means are provided for combining the match signal from the match output signal with the chain bit for a particular data word register to provide a logical match input signal to the next chain bit. A wired-AND functions is provided for combining the match output signals from a plurality of comparators so to indicate that at least one match for a comparand has occurred in the content addressable memory system. The logic means includes multiplexer means having one input terminal coupled to a match output signal and having another input terminal coupled to the output of a status bit register of the register means. The multiplexer means has a selection input terminal for receiving the output signal of the wired-AND and the multiplexer means has an output terminal which provides a logical match input signal to the priority encoder.

A method is provided according to the invention for expanding the memory width of a content-addressable memory CAM. A multi-register array for storing a plurality of data words is provided. A much larger data word, or a data line, is formed from one or more data words. For example a 144-bit data line is formed of three 48-bit data words. Each word of a data line is provided with a start bit, which is activated to indicate the first word of a multi-subword data line. Each of the words is provided with a chain bit which is activated to indicate that the word matches a word of a multi-word search argument. A matching operation for a data line is started by moving the start bit to the chain bit on all words. Consequently, only the first word of a line will have its chain bit set. The first word of data line is compared with a corresponding word of a search argument to produce a chain bit indicating a match. The chain bit is stored in the next chain-bit register of the CAM-array. Additional chain bits are produced by sequentially comparing subsequent words of the data line with the corresponding words of the search argument. A match output signal is provided if all of the corresponding subwords match.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6 is a table listing the registers and their respective data source and destinations.

FIG. 7 shows the bit assignments for the status register.

FIG. 8 shows the bit assignments for the command register.

FIG. 9 shows a summary of the commands in a CAM system according to the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
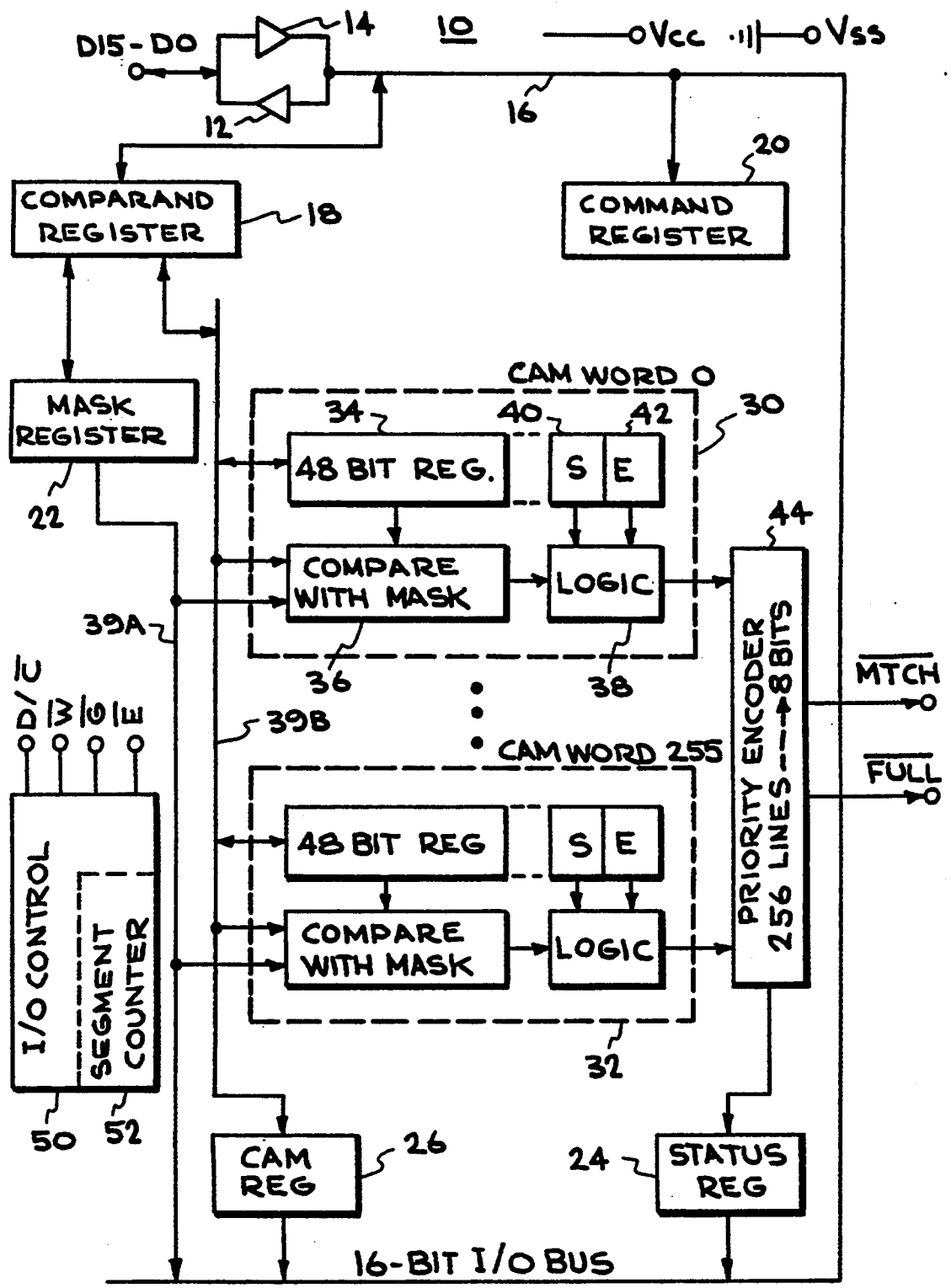
FIG. 1 is a block diagram of a prior art content-addressable memory CAM with a capacity of 256 words and fixed word-widths of 48 bits.

FIG. 1 is a block diagram of a prior art, integrated-circuit CAM system, which is supplied by Advanced Micro Devices, Inc. of Sunnyvale, Calif., as the Am99C10 Content-Addressable Memory CAM. This CAM design has a capacity of 256 data words, each having a width of 48 bits plus a skip bit and an empty bit, with no provision made for expansion of data words greater than 48 bits. To reduce the pin count for the integrated circuit, data is handled in sub-words of 16 bits. The present invention provides an improvement in the ability of a CAM such as the Am99C10 to handle data words having widths significantly greater than 48 bits, while imposing minimal additional operational or circuit requirements on the CAM operation or circuit design.

TERMINAL DESCRIPTIONS

The assignment of I/O pins, or terminals, for an integrated-circuit version of the CAM system according to the invention are essentially the same as the pins of the Am99C10 as shown in FIG. 1.

D/C—The D/C input terminal is used for selection of the data or command mode of operation. A logical LOW state on this input terminal selects the command mode of operation, while a HIGH state on this input terminal selects the data mode of operation.

W—The W, or Write Enable, input terminal controls the operation of writing to the internal registers and the CAM Array of storage registers. New data is written into a register or a memory location by setting the appropriate states at terminals D/C and E, and by switching the state of terminal W to a LOW state and to a HIGH state.

G—The G, or Output Enable, input terminal controls reading of the internal registers. A LOW state on both the E and the G input terminals gates a selected register onto a data bus and turns on output drivers.

E—The E, or Chip Enable, input terminal, with a LOW state on it, enables the chip operations as specified by the state of the D/C, W, G input terminals and a Command Register. A HIGH state on this pin powers down the chip. These terminals must be at a LOW state during all operations including match operations.

$D_{15-0}$—The Data Bus I/O terminals are provided for each bit of a 16-bit, bidirectional, three-state bus where D0 is the least significant bit position and $D_{15}$ is the most significant bit position. A HIGH state on any of the date lines of the Data Bus specifies a logic 1 and a LOW state specifies a logic 0. The Data Bus is not driven by the device when the W terminal is LOW, when the G terminal is HIGH, or when the chip enable terminal E is at a HIGH state.

FULL—The FULL, Address Full, output terminal having a LOW state on it indicates that all of the words in the 256 address locations of the CAM Array are full. A HIGH on this output terminal indicates that one or more words in the CAM Array are still available or that the FULL output terminal is disabled. The FULL output terminal is in the HIGH state when the E terminal is at a HIGH state and is otherwise valid.

MTCH—The MTCH, match, output terminal having a LOW state indicates that the masked data of the Comparand Register and one or more words in the CAM Array are matched. A HIGH on this output terminal indicates a mismatch or that the MTCH output terminal is disabled. The MTCH output terminal is invalid or in the HIGH state when the E terminal is at a HIGH state; otherwise the MTCH terminal is valid.

$V_{cc}$ is the +5 volt power supply pin and $V_{ss}$ is the ground, or 0 volt supply pin for the integrated circuit.

DESCRIPTION OF THE PRIOR ART

Referring again to FIG. 1 of the drawings, a block diagram of the Advanced Micro Devices Am 99C10 integrated CAM device 10 is shown having the input and output terminals as described hereinabove. The tri-state I/O terminals for the 16 I/O bits D15-D0 are coupled through an output driver 12 or an input driver 14 to a 16-bit I/O bus 16. Connected to the I/O bus 16 are five registers: a comparand register 18, a command register 20, a mask register 22, a status register 24, and a CAM register 26.

A CAM array comprises a bank of 256 comparison blocks for CAM WORD 0 (shown as reference numeral 30) through CAM WORD 255 (shown as reference numeral 32). As typically shown for CAM WORD 0, each comparison block includes a 48-bit-wide register 34 and masked logic comparator 36 for each of the 48-bits. Each of the comparison blocks are connected in parallel to the 16-bit I/O bus 16. The CAM array operates to provide for a one-cycle, simultaneous comparison of a 48-bit comparand word stored in the comparand register 18 against all of the 256 words stored in the respective 48-bit registers (typically 34) of each matching cell of the array 30. As typically shown for the matching cell 30 for CAM Word 0, each of the comparison blocks includes a logic circuit 38. The mask register 22 is connected to each of the masked comparators (typically shown as 36) through a mask bus 39A to mask selected bits from being compared with the contents of the various 48-bit registers (typically shown as 34). The 48-bit registers are written to and read from using a comparand bus 39B. The logic circuit 38 receives an input signal from the masked comparator (36) as well as from a start-bit storage location 40 and an empty-bit storage location 42 (typically shown for CAM WORD 0). If any one or more of the 256 words in the CAM array exactly matches the bit pattern of the 48-bit input data word, a priority encoder 44 connected to the respective 256 output terminals of the CAM array provides a match flag signal at the MTCH output terminal and provides the 8-bit address of the highest priority CAM WORD to the status register 24.

When a matching cycle is initiated, every CAM WORD matching block compares each bit in its 48-bit register against the appropriate corresponding bit of the 48 bit comparand stored in the comparand register 18. Additionally, a logic "1" (HIGH level) set in any one of the Mask Register bits disables that one bit position for purposes of comparison in the various CAM WORD cells of the CAM array. A match is declared if any enabled CAM cells find an exact comparison with the input data. Each CAM array word that finds a match activates an internal signal called Match Line (ML). There are 256 match lines: ML0 to ML255.

Note that, as typically shown for CAM WORD 0 by reference numeral 40,42, each of the 256 CAM WORDS of the CAM array has two additional bits of memory associated with it—a skip bit S and an Empty bit E. The actual size of the CAM array is therefore 256×50 (48+2) bits. Both the skip bit and empty bit can disable a match output signal for their respective CAM WORD. The skip bit is used in situations where there are multiple matches. It gives the user the ability to detect additional words that were matched in addition to the word which has the lowest address and the highest priority. The empty bit indicates available addresses or empty addresses in the CAM register, that is, addresses into which data can be written.

The empty bit is also used by the priority encoder 44 to identify the lowest address of a CAM array word with an empty bit set, if no match has occurred for any of the other ones of the 256 CAM WORDs. If a match operation does not result in a positive match (the MTCH signal is HIGH) and if the CAM Array is not full (the FULL signal is HIGH), the priority encoder 44 generates the lowest empty address, which is stored in the status register 24.

The I/O control module 50 provides control signals for the system in accordance with control signals provided at the input terminals of the integrated circuit. Data is transferred to and from the Am99C10 in 16-bit words. Data for the 16-bit command register 20 and 16-bit status register 24 are transferred in one read or write cycle. Data for the 48-bit registers, that is, the comparand register 18, the mask register 22 and the CAM register 26, are transferred to and from the integrated circuit in three cycles. Data transfer to and from each of the 48-bit registers is done by dividing each register into three 16-bit segments. A two-bit segment counter 52 is used to select which segment of a 48-bit register is to be loaded or read.

The segment counter 52 is a two-bit binary counter that counts from 0 to 2 (modulo-three) and can be preset by writing an appropriate command code to the command register 20. The segment counter 52 is incremented after each data read or write cycle if the CAM is in the 48-bit mode. This allows a 48-bit register to be loaded or read in three successive cycles. The counter is clocked by the LOW-to-HIGH transition of W in case of a Data Write cycle and by the LOW-to-HIGH transition of G in case of a Data Read cycle. When the Am99C10 is set to a 48-bit mode, the user will normally execute 3 Data Write cycles or 3 Data Read cycles in sequence to transfer a 48 bit data word. At the end of such a sequence the state of the segment counter 52 is equal to its initial state before the data transfer began. This allows continuous 48-bit transfers without having to preset the segment counter 52 between words, which is useful in the CAM's normal operating mode of checking a stream of 48-bit words for a match.

In a 16-bit mode of operation, the segment counter 52 is not incremented and it points to one of the three segments of the comparand register 18, the mask register 22, and the CAM register 26. Writing and reading the selected segment of those registers is achieved in one cycle. However, internal transfers between the registers and the CAM array as well as match operation are done on all 48 bits.

DESCRIPTION OF THE PRESENT INVENTION

Figure 2:
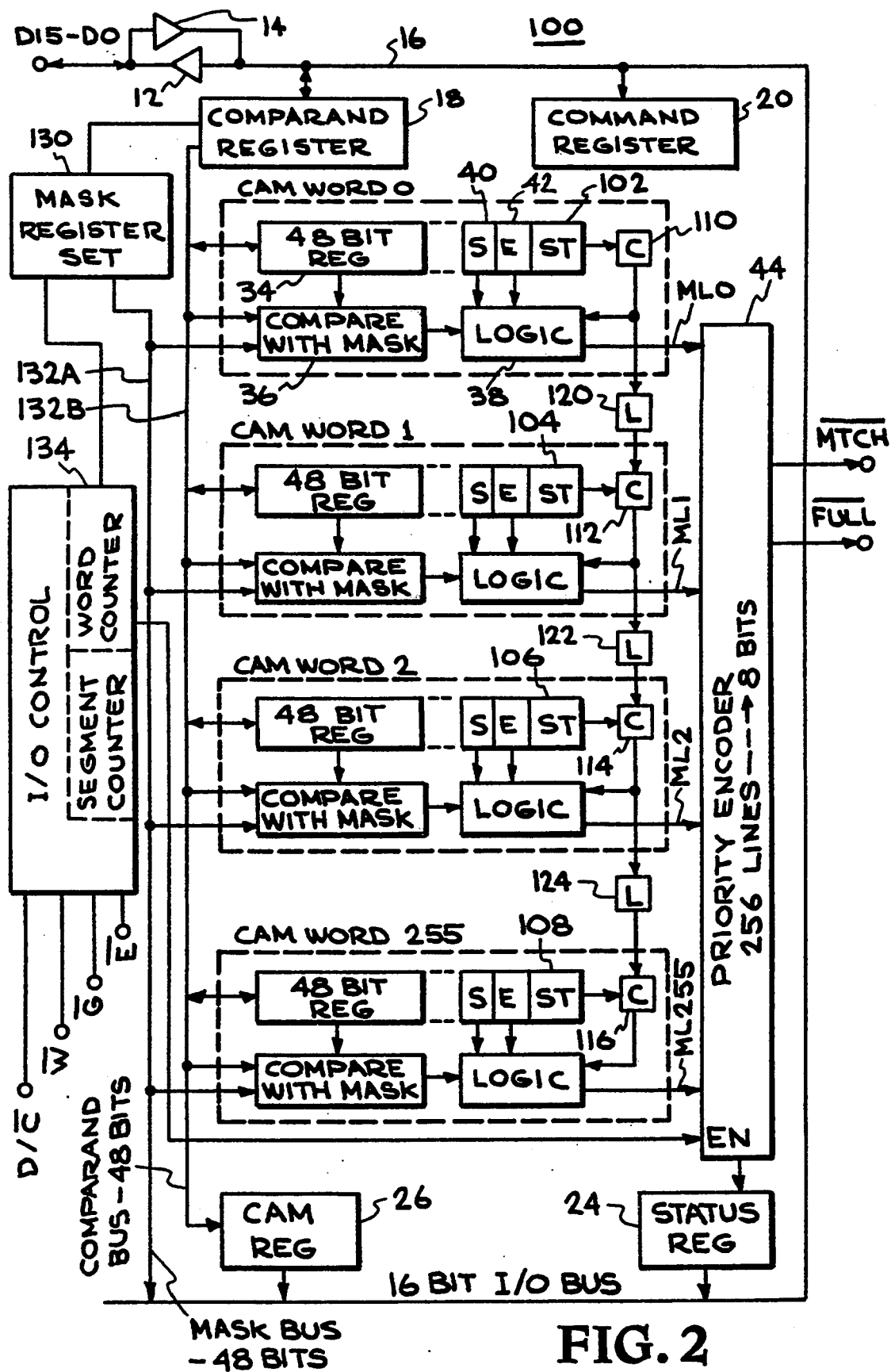
FIG. 2 is a block diagram of a system according to the invention which uses a "start" bit and a "chain" bit to implement multi-word "lines," or words with extended widths.

FIG. 2 is a block diagram of an integrated-circuit CAM system 100, according to the invention. This system is similar to and has many of the same elements as the Am99C10 CAM as described in connection with FIG. 1 hereinabove. The same reference designations and numerals are used for like elements, including the terminals D/C, W, G, E, D15–D0, FULL, and MTCH. Connected to the 16 bit I/O bus 16 are the comparand register 18, the command register 20, the status register 24, and the cam register 26. The priority encoder 44 receives 256 request line and is controlled by an enable signal EN.

The CAM system according to the invention has additional logic and programmable interconnections which give the CAM system the ability to provide for sequential comparison of a variable number of multiple CAM WORDs. The present invention provides an improvement in the ability of a CAM similar to the Am99C10 to internally handle very large data words, that is, data words having widths significantly greater than 48 bits, while imposing minimal additional operational or circuit requirements on the CAM operation or circuit design. A data word significantly greater than 48 bits is formed by serially combining a variable number of 48-bit words into a "line". Each of the 48-bit words forming a part of a line, or a multi-word very large data word, has associated with it two extra bits. A start bit ST indicates that a 48-bit word is the first word in the line. A chain bit C indicates that a particular part of a line, that is, one of the 48-bit words of a line, matches a corresponding part of a comparand for the entire line. The chain bit for each 48-bit word for a comparison block is set by the logic circuit (typically shown as 38) for each comparison block.

Each of the comparison blocks of the system 100 includes a storage register in each comparison block for a start bit ST (typically shown by reference numerals 102, 104, 106, 108 respectively for CAM WORD 0, CAM WORD 1, CAM WORD 2 and CAM WORD 255). Each of the comparison blocks of the system 100 also includes a storage register for a chain bit C (typically shown by reference numerals 110, 112, 114, 116 respectively for CAM WORD 0, CAM WORD 1, CAM WORD 2 and CAM WORD 255). Latches (typically shown as 120, 122, 124) are provided for latching a true chain bit from a previous comparison block to the next comparison block for a particular line. For example, latch 120 links the chain-bit register 110 of CAM WORD 0 to the chain-bit register 112 of CAM WORD 1.

The chain bit is included in the match decision for each word of a multi-word line. For the first word-matching comparison of a line, only the first word's chain bit is set. This is accomplished by loading all chain bits from their respective start bits. Since only the first word in a line has a 1 in its start bit, only the first word will have a 1 in the chain bit during the first word matching operation. The result of the first word-match is loaded into the chain bit of the second word in the line at the start of the next comparison cycle. The number of words in a line is designated by N. When the N comparisons for a N-word line have been performed, the last word in the line will have a match condition if the last word and all of the preceding words in a line have matched their corresponding comparands. For example, for N=3, a 3-word, 144 bit comparison operation is accomplished by having the start bits ST set for every third word, beginning with CAM WORD 0. After three compares of 48 bits each, the third CAM WORD of one or more of lines is active if matches had occurred. The result of the last comparison for a CAM WORD of a line is inputted to the priority encoder 44 by using the enable EN signal.

In effect, the chain bit provides a serial AND function to extend the word-width handling capability of a CAM. If no match occurs in one word of a line, the chain bit for the next word of the line is not set. The start bit from the first word of a line is loaded into the chain bit of the first word of each of the groups of N words forming a line to thereby automatically provide for starting another multi-word matching comparison and matching operation without having to set individual chain bit in each of the first words of a line. The start bits are appropriately loaded under software control to control the line size, that is, how many words form a line. For example, a line may be formed as integer multiples of 48 bits.

A mask register set 130 is provided for storing a set of N mask words, where N correspond to the number of words N in an N-word line. The appropriate mask word (which is 48 bits in the exemplary embodiment of the invention shown) is provided to the masked comparators (typically shown by reference numeral 36) on a 48-bit mask bus 132 A. The value of N may range from 1 to 255, corresponding to a line with 1 to 255 words in it. From a practical perspective N has a more limited number of mask words. A word counter circuit 134 keeps track of which words of the lines are being compared and provides appropriate addresses to the mask register set 130 to access the appropriate mask word. Data is loaded into the 48-bit registers (typically shown as 34) through a 48-bit comparand bus 132B.

Figure 3:
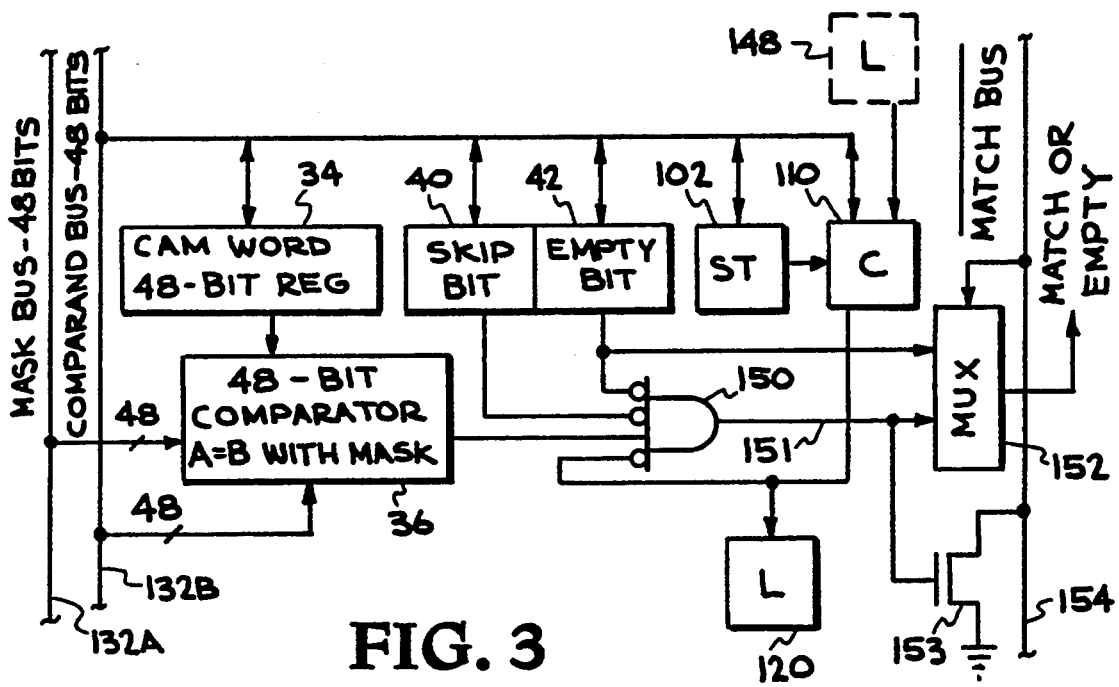
FIG. 3 is a block diagram for the circuits to handle one CAM word of a system according to the invention.

FIG. 3 shows in somewhat more detail the system elements for one comparison block for CAM WORD 0 of a system according to the invention. The 48-bit comparand bus 132B provides data to be stored in the 48-bit register. The skip bit, the empty bit, and the start bit are also loaded into their respective registers 40, 42, 102 using the bus 132B. The 48-bit comparand bus 132B also provides comparand data from the comparand register 18 to be applied to the masked comparator 36. The 48-bit mask bus 132A provides the appropriate mask word from the mask register 130. Latch 120 stores the contents of the chain-bit-register 110. A latch 148 is shown in dotted form to indicate that the chain bit from a preceding comparison block is stored in a latch for subsequent transfer to the chain-bit-register of a succeeding comparison block.

The output logic signal from the masked comparator 36, the skip bit from bit-register 40, and the empty-bit logical signal for the bit-register 42 are combined in an AND gate 150 to provide one input logic signal on a signal line 151 to a multiplexer 152. The contents of the empty-bit-register 42 provide the second input logic signal to the multiplexer 152. A HIGH state from AND gate 150 on signal line 151 causes a pull-down transistor 153 to pull a MATCH BUS 154 to a LOW state. The MTCH BUS 154 controls when a match is to be used by the priority encoder 44. The MTCH BUS 154 is controlled by the word counter 134 as well as by the logic which initiates the match operation and the updating of the match address, match bit, and match flag. Pull-down transistors for all of the other comparison blocks are similarly connected to the MATCH BUS 154. The state of the MATCH BUS 154 controls the multiplexer 152 so that, if no match occurs on any of the comparison blocks, the state of the empty-bit-register 42 is outputted from the multiplexer 152 to the priority encoder. If the line 154 is active, the result of the comparison from the AND gate 150 on line 151 is outputted to the priority encoder 44.

The MTCH bus 154 controls when a match indication is going to be used by the priority encoder.

Figure 4:
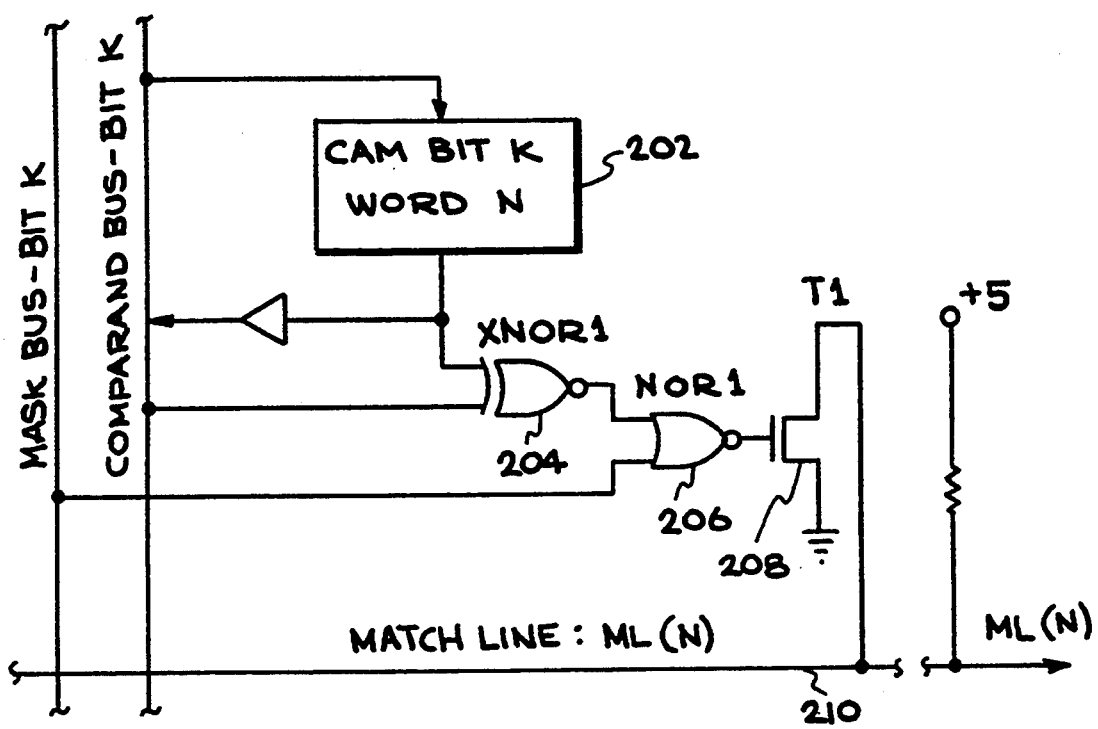
FIG. 4 is a block diagram for the circuits to handle one bit of a CAM system according to the invention.

FIG. 4 shows the elements in the 48-bit register 34, the masked comparator 36, and the logic block 36 of a comparison block of FIG. 1. The elements include a bit-latch 202 for the k-th bit, an exclusive-NOR logic comparator 204, a NOR gate 206 for masking, and a transistor 208 for performing a 48-bit wired-AND across the 48 data bits. The logic comparator 204 exclusive-Nors the contents of the register bit with the corresponding bit of the comparand register. A match between the two bits results in a HIGH level at the output of the exclusive-Nor gate 204. The output of gate 204 is further gated in gate 206 with the k-th bit of the appropriate mask word from the mask register set 130. A HIGH level on either one of the inputs to gate 204 forces its output LOW, indicating a match. The ML(N) signal on line 210 for the Nth comparison block will stay HIGH (indicating a match for that CAM word) if all 48 CAM Cells of this word have their corresponding pull-down shut off by their NOR1 gates. If any one of the 48 NOR1 outputs is HIGH, the ML(N) signal on line 210 will be forced LOW, indicating a mismatch.

Referring to FIG. 2, the priority encoder 44 identifies the address of the CAM comparison block in which a match is found for the comparand. All 256 masked comparators of the CAM array receive the same bit pattern for matching at the same time, and more than one of them can find a match with the masked data. All 256 ML(N) lines (ML1,ML2,ML3,ML255) are presented to the priority encoder internal logic circuit that decides which one of the comparators that have an active ML line has the lowest address. In other words, the priority encoder determines which matching comparison block has the highest priority. If at least one ML is active the priority encoder will activate the MTCH terminal and at the same time will set a MTC bit in the status register. The priority encoder 44 will also transfer the 8 bit address of the lowest matching CAM array word to the status register.

Figure 5:
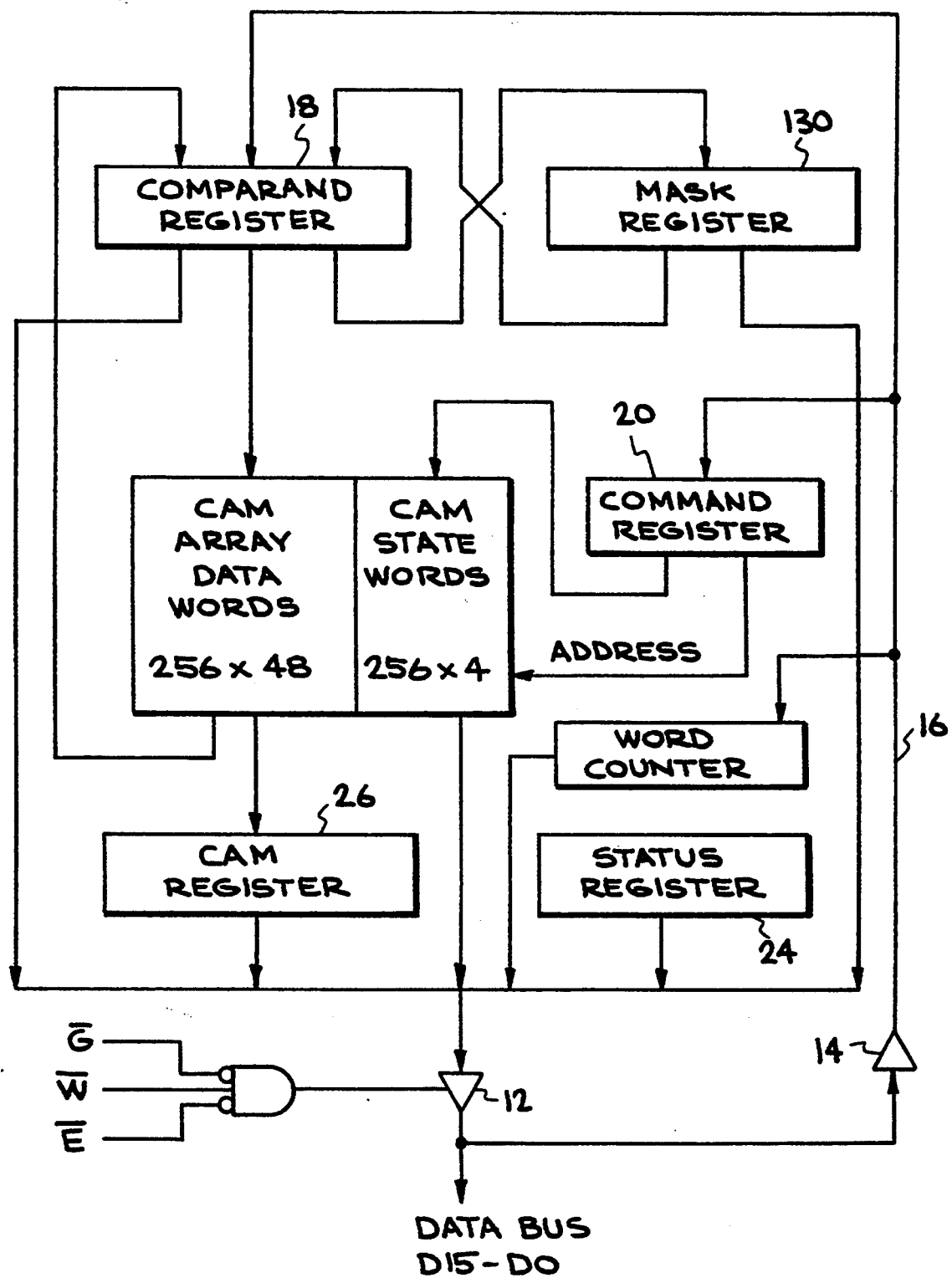
FIG. 5 is a block diagram showing the registers and their interconnection in a system using a start bit and a chain bit according to the invention.

FIG. 5 shows the Am99C10 registers and their interaction with each other and with the CAM array. FIG. 6 lists the registers and their respective data sources and destinations. Five programmable registers are involved in data transfers. The command register 20 and the and status register 24 are each 16 bits wide. The comparand register 18, the mask register 130, and the CAM register 26 are each 48 bits wide.

All data is transferred to and from the CAM over the 16-bit bidirectional data bus 16. Data transfer is controlled by a combination of the 4 control signals (E, D/C, W, and G), as described in the Terminal Description section hereinabove. Data is written into the CAM by placing the data on the data bus 16 and activating terminals W and E. When terminal D/C is at the LOW state in the Command Write mode, the input data is loaded into the command register 20. When the terminal D/C is high in a HIGH state in the Data Write mode, the input data is loaded into the comparand register 18.

Data is read out from the CAM with the output drivers enabled when terminals G and E are low and terminal W is high. When terminal D/C is low in the status read mode, the contents of the status register 24 are gated onto the data bus 16. When terminal D/C is high in the data read mode, one of the data registers is gated onto the data bus. This register is selected by the contents of the command register 20. Prior to being read, a command is loaded into the command register 20 to select which of the internal registers is to be read.

While data can be read from any register by loading the appropriate command into the command register 20, data can be written only to the comparand register 18. Data to be written either to the mask register set 130 or to the CAM array 48-bit registers must first be written into the comparand register 18 and then transferred either to the mask register 130 or to the CAM array 48-bit registers by writing the appropriate transfer command to the command register 20.

CAM Array-Reading and Writing—To write a word into the CAM array, the data is first loaded into the comparand register 18 and then transferred from the comparand register 18 to the register in the selected CAM comparison block by executing a transfer command. The transfer command is executed by writing a command word (command code=6 or E) into the command register 20. The transfer command contains the address of the CAM comparison block which is to be written into.

To read a word from the CAM array, data is transferred from the CAM array to either the comparand or CAM registers by writing the appropriate command (command code=7 or D, respectively) into the command register 20. The transfer command contains the address of the CAM comparison block to be read. The data is then read from the register selected by the command.

Writing into the skip or empty bit in a CAM comparison block is done directly by writing the appropriate command code (command code=9 or A, respectively) into the command register 20. The command word contains the value of the skip or empty bit to be written and the address of the CAM comparison block.

The same command codes (9 or A) which are used to set a specific skip or empty bit can also be used to set all skip or empty bits in the CAM array. If bit 1 of these command words is a one, the address portion of the command is ignored and the value of the skip or empty bit is written into all words of the CAM array. This is useful in clearing all skip and empty bits. The skip and empty bits of a CAM word are also cleared to zero when data is written into the CAM using command code E. This allows writing a new word of data into an empty CAM word without requiring an extra cycle to clear the skip and empty bits. The skip and empty bits of all CAM words can be preset to the empty state by writing an initialize command (command code=0) to the command register 20. Initialize clears all skip bits to zero and sets all empty bits to one, corresponding to an empty CAM condition.

Match Operations—Comparison of data in the comparand register 18 against the 256 words of data in the CAM array is called a match operation. The result of a match operation is a match address which appears in the status register 24 and the activation of the MTCH and FULL flags.

FIG. 7 shows the bit assignments for the status register 24. A match operation is initiated by writing a command into the command register 20 or by writing data into the comparand register 18. A match operation begins after a single data write to the comparand register 20 in 16-bit mode or after three data write cycles to the comparand register 18 in the 48-bit mode. If a match occurs, the MTC bit is set in the status register 24 and the MTCH terminal pin is activated if it has been enabled. The address of the word in the comparison block that matched the masked comparand appears in the lower 8 bits of the status register 24. If more than one match occurs, the MUL bit is set in the status register, indicating a multiple match. In this case, the match address is that of the match word with the lowest numerical address. If no match occurs, the MTC bit and MTCH flag are not set, and the address is that of the first empty word, i.e., the empty word with the lowest address.

Both the MTCH flag and the MTC bit change their state for 16-bit and 48-bit data write modes, and for the command write mode for commands 9 and A. Commands 3, 4, 6, 7 and E change the state of the MTC bit only but do not affect the physical MTCH flag.

Match and Full Flags—The Am99C10 has two output terminals at which its status is indicated—FULL and MTCH. A Full signal, FULL, indicates whether the CAM array is full or not. A low level on FULL indicates that all 256 words of the CAM array are full. A HIGH on this output terminal indicates that one or more words in the CAM array are still available or that the FULL output is disabled. The FULL output can be disabled (=HIGH) under program control or when the chip is disabled (Chip Enable terminal E is high).

The signal at the Match terminal, MTCH, indicates whether a match has been detected, i.e., that the masked data of the comparand register 18 and one or more words in the CAM array are matched. A HIGH on this output terminal indicates that a mismatch has taken place or that the match output is disabled. The MTCH output terminal can be disabled (=HIGH) under program control or when the chip is disabled (Chip Enable terminal E is high).

Status Register Format—The Status register shows the results of match operations and the contents of the segment counter. The status register 24 is read onto the data bus 16 by executing a status-read cycle. Since it takes time to encode a match address a status-read cycle cannot immediately follow a command-write cycle or a data-write cycle if a valid match address is sought. A time delay after the last command or data write before reading the status register 24 will guarantee proper address encoding. A status-read operation does not affect the state of the flags or other register contents.

The status register 24 has 3 fields—the Address field ($A_0$-$A_7$), the Segment Counter State field (S0-S1), and the Flags field (MTC, MUL and FUL), as shown in FIG. 7:

MTC—A LOW on MTC ($D_{15}$) indicates that at least one word in the CAM Array and the masked data of the Comparand Register are matched. A HIGH indicates that no word in the CAM Array found a match. The MTC bit is the same as the match output signal MTCH during data writes and commands 9 and A.

MUL—A LOW on MUL ($D_{14}$) indicates that two or more words in the CAM Array match the masked data of the Comparand Register. It is activated during a Match operation and latched by an internal clock at the end of the Match cycle.

FUL—A LOW on FUL (D13) indicates that the CAM Array is full. The FUL flag is the same as the full output signal FULL except the FUL flag cannot be disabled. It is activated during a Match operation and latched by an internal clock at the end of the Match cycle.

S1, S0—The Segment Counter bits (S0-S1) are driven by the two flip-flops that comprise the Segment Counter. These two bits ($D_{10}$ and $D_{11}$) reflect the current state of the Segment Counter.

$A_7$-$A_0$—Lowest address of the matched word in the CAM when data in the Comparand Register and the data in the CAM are matched (MTCH=L, MTC=L and FULL=don't care). Lowest address of empty 48-bit word in the CAM when data is mismatched and the CAM is not full (FULL=H). Address is undefined when data is mismatched and CAM is full. After initialize, $A_7$-$A_0$ holds the value FF(Hex). Once a data read or write or a command write is executed, $A_7$-$A_0$ holds the address of the first match or the first empty location.

Command Register Format—FIG. 8 shows the bit assignments for the command register 20. The Am99C10 can execute a variety of commands. Each command is executed by writing the appropriate command word to the command register 20. All commands are executed during the write pulse applied to the write clock terminal, W.

FIG. 9 shows a summary of the commands.

COMMAND DESCRIPTIONS

Op Code 0—Initialization—All Skip-bits are set to "0" (LOW level) meaning-don't skip, and all Empty-bits are set to "1" (HIGH level) meaning-empty. This is equivalent to resetting the CAM Array. The MTCH and FULL outputs are enabled. The mode is set to 48-bit mode. The Mask Register and Segment Counter are reset to zero. Subsequent data writes and reads are to and from the Comparand Register. When the need to initialize the device occurs int he middle of a 48-bit write sequence, the segment counter must be reset to zero before the initialize command is executed. It is recommended to always issue opcode F prior to issuing the initialize command.

Op Code 1—Flag Output Control—This command controls the enable and disable of the FULL and MTCH status output pins. The S0 and S1 fields of this command are latched into the control logic. Once loaded, they control the status output pins FULL and MTCH as follows: When S0 is 0, the FULL output is disabled and remains unconditionally HIGH. When S0 is 1, the FULL output is enabled and may be asserted when E is low. When S1 is 0, the MTCH output is disabled and remains unconditionally high. When S1 is 1, the MTCH output is enabled and may be asserted if E is low.

Op Code 2—Mode Select—This command sets the 99C10 into the 16-bit or 48-bit mode. The S1 bit in the command is loaded into the 16/48-bit mode control register. The 16-bit mode is enabled when S1 is 0, and the 48-bit mode is enabled when S1 is 1. The Am99C-10A will remain in the mode selected until another Command Write is executed with Op Code "0" or "2".

Op Code 3—Move Comparand Register to Mask Register—The 48-bit contents of the Comparand Register is loaded into the Mask Register. The Segment Counter is not affected. A Match cycle will begin automatically following this command.

Op Code 4—Move Mask Register to Comparand Register—The 48-bit contents of the Mask Register is loaded into the Comparand Register. The Segment Counter is not changed. A Match cycle will begin automatically following this command.

Op Code 5—Enable Output from State Memory to Data Bus—This command selects a State word in the CAM Array as the source of data to be read. The Start-bit, the Chain-bit, the Skip-bit and the Empty-bit, Start-bit appear on bits $D_{12}$, $D_{13}$, $D_{14}$ and $D_{15}$ of the Data Bus, all other bits of the bus are driven LOW. The Segment Counter is not changed.

Op Code 6—Move Comparand Register to CAM Array—The 48-bit contents of the Comparand Register are written into the CAM Array data word. The 16/48 bit mode select setting does not affect this instruction. The Empty-bit and Skip-bit in the State Memory are not changed. The CAM Array address is specified by the Command Register address field. The Segment Counter is not changed. A Match cycle will begin automatically following this command.

Op Code 7—Move CAM Array to Comparand Register—The 48-bit contents of the CAM Array data word specified by the address field are loaded into the Comparand Register. The Segment Counter is not changed. The State Memory is not changed. The 16/48 bit mode select setting does not affect this instruction. A Match cycle will begin automatically following this command.

Op Code 8—Reserved.

Op Code 9—Skip-bit Control—When bit 11 in the Command Register is LOW, S0 is loaded into the Skip-bit within the State word location specified by the Command Register address field. A Match cycle will begin automatically following this command.

When bit 11 in the Command Register is HIGH, S0 is loaded into all skip-bit memory locations. The Segment Counter is not changed. A Match cycle will begin automatically following this command.

Op Code A—Empty-bit Control—When bit 11 in the Command Register is LOW, S0 is loaded into the Empty-bit within the State word location specified by the Command Register address field. A Match cycle will begin automatically following this command.

When bit 11 in the Command Register is HIGH, S0 is loaded into all Empty-bit memory locations. The Segment Counter is not changed. A Match cycle will begin automatically following this command.

Op Code B—Enable Output from Comparand Register to Data Bus—This command selects the Comparand Register as the source of data to be read. The S0 and S1 data in the Command Register are clocked into the Segment Counter at the end of this Command Write cycle. When S0 and S1 are both 0 or both 1, the Segment Counter is reset to zero. Subsequent Data Read operations result in data flowing from the Comparand Register segment specified by the Segment Counter to the Data Bus. In 48 bit mode each Data Read cycle will automatically increment the modulo-three Segment Counter.

Op Code C—Enable Output from Mask Register Set to Data Bus—This command selects the Mask Register as the source of data to be read. The S0 and S1 data in the Command Register are clocked into the Segment Counter at the end of this Command Write cycle. When S0 and S1 are both 0 or both 1, the Segment Counter is reset to zero. Subsequent Data Read operations result in data flowing from the Mask Register segment specified by the Segment Counter and Word Counter to the Data Bus. In 48 bit mode each Data Read cycle will automatically increment the modulo-three Segment Counter, and the Word Counter modulo to the maximum number of mask registers.

Op Code D—Move CAM to CAM Register, Enable Output from CAM Register to Data Bus—This command selects the CAM Register as the source of data to be read. The S0 and S1 data in the Command Register are moved to the Segment Counter. When S0 and S1 are both 0 or both 1, the Segment Counter is reset to zero. The CAM Array word specified by the address field is transferred to the CAM Register. Subsequent Data Read operations result in data flowing from the CAM Register segment specified by the Segment Counter to the Data Bus. In 48 bit mode each Data Read cycle automatically increments the modulo-three Segment Counter.

Op Code E—Move Comparand Register to CAM (Set Empty-bit and Skip-bit LOW)—The 48-bit contents of the Comparand Register is written into the CAM Array data word specified by the address field. The 16/48 bit mode select setting does not affect this instruction. Both the Empty-bit and the Skip-bit in the State Memory address specified by the Command Register address field are set cleared to zero (Not Empty and Don't Skip). The Segment Counter is not changed. A Match cycle will begin automatically following this command.

Op Code F—Set Segment Counter—This command clocks the data in S1, S0 into the Segment Counter. When S1, S0 are both 0 or both 1, the Segment Counter is reset to 0.

Op Code 10—Set Line Length—This command sets the word counter to designate how many words are in a multi-word line. All chain bits are cleared.

Op Code 11—ST Bit Control—This command gives direct control over the ST bits in all memory locations.

Op Code 12—ST to Chain Bit Transfer—This command loads each chain bit with the value which exists in its respective start bit.

Op Code 13—Word Counter to Data Bus—This command selects the word counter as the source of data to be read. Only bits 7 through 0 are enabled and all other bits are driven low.

Op Code 14—Comparand to Word Counter—This command loads the word counter with the value held in the comparand's segment 0. The segment counter is set to 00.

Op Code 15—Reset Segment and Count Counters.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A content addressable memory system having a capability of matching a data line formed from a sequence of two or more data words, each of said data words having a predetermined width, comprising:
    means for storing a comparand having said predetermined width;
    a plurality of comparison blocks;
    each of said comparison blocks including:
        a register, each register storing a data word having said predetermined width, each register including means for storing a start bit, which indicates if a data word is the first data word of a particular data line, and each register including means for storing a chain bit, which indicates that a match has occurred between the comparand and the data word stored in said register;
    each comparison block including comparator means for comparing said data word stored in the register of said comparison block with said comparand and for providing a positive match output signal from said comparator means;
    each of said comparison blocks including means for loading the start bit of said one of said registers into the means for storing the chain bit of a register;
    each comparison block including latch means for storing the value of the chain bit from one of said registers and for inputting the stored value of the chain bit to another register means;
    priority encoder means for receiving the match output signals from each of said comparator means for said comparison blocks, said priority encoder means including means for providing an output code word identifying the highest-priority comparison block which provides a positive match output signal to said priority encoder means; and
    wherein said comparator means includes means for masking predetermined bits of said data word and wherein said means for masking includes a mask register set for containing masking words corresponding to various words of said data line.

2. The content addressable memory system of claim 1 including a counter for keeping track of the data words of said data line.

3. A content addressable memory system having a capability of matching a data line formed from a sequence of two or more data words, each of said data words having a predetermined width, comprising:
    means for storing a comparand having said predetermined width;
    a plurality of comparison blocks;
    each of said comparison blocks including:
        a register, each register storing a data word having said predetermined width, each register including means for storing a start bit, which indicates if a data word is the first data word of a particular data line, and each register including means for storing a chain bit, which indicates that a match has occurred between the comparand and the data word stored in said register;
    each comparison block including comparator means for comparing said data word stored in the register of said comparison block with said comparand and for providing a positive match output signal from said comparator means;
    each of said comparison blocks including means for loading the start bit of said one of said registers into the means for storing the chain bit of a register;
    each comparison block including latch means for storing the value of the chain bit from one of said registers and for inputting the stored value of the chain bit to another register means;

priority encoder means for receiving the match output signals from each of said comparator means for said comparison blocks, said priority encoder means including means for providing an output code word identifying the highest-priority comparison block which provides a positive match output signal to said priority encoder means;

wherein said comparator means further includes logic means for combining the positive match signal from said comparator means with the chain bit to provide a logical match input signal to said priority encoder;

means for combining the match output signals from the comparator means for a plurality of comparison blocks, said means for combining providing an output signal indicating that at least one match for the comparand has occurred in said content addressable memory system; and wherein said logic means includes multiplexer means having one input terminal coupled to a match output signal and having another input terminal coupled to the output of an EMPTY bit register of said register, where the state of said EMPTY bit register indicates an empty bit set in the register, said multiplexer means having a selection input terminal for receiving the output signal of said combining means, and said multiplexer means having an output terminal providing said logical match input signal to said priority encoder.

4. A method of expanding the memory width of a content-addressable memory CAM to provide the capability of matching a data line formed from a sequence of two or more data words, each of said data words having a predetermined width, comprising the steps of:

storing a comparand;

providing a plurality of comparison blocks, each comparison block having a register;

storing in each register a data word having said predetermined width, storing in each register a start bit, which indicates if a data word is the first data word of a particular data line, storing in each register a chain bit, which indicates that a match has occurred between the comparand and the data word stored in said register;

providing each comparison block with a comparator;

comparing the data word stored in the register of each comparison block with the comparand and providing a positive match output signal from said comparator;

replacing the chain bits of the registers with the start bits of the registers;

storing the value of the chain bit from one of the registers and inputting the stored value of the chain bit to another register means;

receiving the match output signals from each of the comparators and providing an output code word identifying the highest-priority comparison block which provides a positive match output signal to a priority encoder; and masking predetermined bits of the data word using a mask register set for containing masking words corresponding to various words of said data line.

* * * * *